United States Patent [19]

Balzano

[11] Patent Number: 4,757,279
[45] Date of Patent: Jul. 12, 1988

[54] METHOD AND APPARATUS FOR ASSISTING A PHASE LOCK LOOP IN OBTAINING ACQUISITION

[75] Inventor: Jean-Michel Balzano, Perros-Guirec, France

[73] Assignee: Alcatel, Paris, France

[21] Appl. No.: 105,363

[22] Filed: Oct. 7, 1987

[30] Foreign Application Priority Data

Oct. 8, 1986 [FR] France .................................. 86 14010

[51] Int. Cl.⁴ ............................................... H03L 7/12
[52] U.S. Cl. ............................................ 331/4; 331/8;
331/17; 331/25; 331/DIG. 2; 375/120
[58] Field of Search ...................... 331/4, 8, 17, 18, 25, 331/DIG. 2; 375/108, 120

[56] References Cited

U.S. PATENT DOCUMENTS 4,015,083  3/1977  Bellisio ................................ 375/120
4,246,546  1/1981  McDonald ............................... 331/4
4,423,390  12/1983  Waters ................................... 331/4

Primary Examiner—Eugene R. LaRoche
Assistant Examiner—David Mis
Attorney, Agent, or Firm—Sughrue, Mion, Zinn, Macpeak, and Seas

[57] ABSTRACT

The method consists in using a sawtooth signal at the output from a lowpass filter of a phase lock loop, in multiplying it by a low frequency squarewave signal, in integrating the resulting multiplied signal in order to obtain a sweep signal, and in controlling a voltage controlled oscillator of the phase lock loop by means of the sweep signal. The apparatus comprises a multiplier (7) and a low frequency generator (8). It may also include, prior to the multiplier, a hysteresis comparator (5) and a highpass filter (6). The output (S7) of the multiplier (7) is connected to a loop filter (3) in said phase lock loop in order to integrate the multiplied signal.

4 Claims, 3 Drawing Sheets

FIG. 2
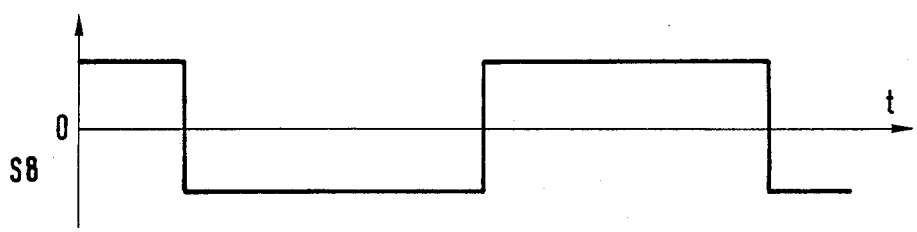
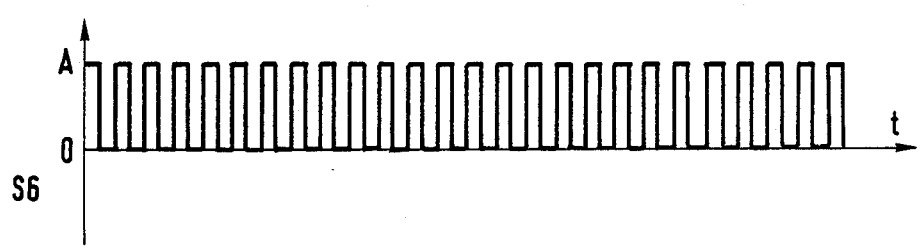
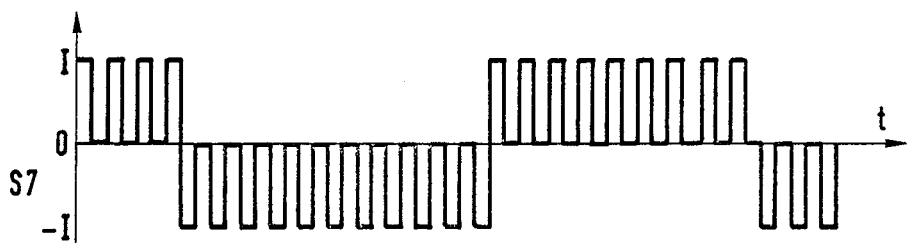
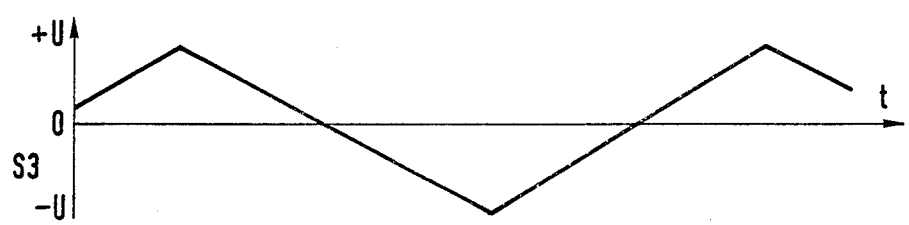

METHOD AND APPARATUS FOR ASSISTING A PHASE LOCK LOOP IN OBTAINING ACQUISITION

The present relates to phase lock loops, and more particularly to a method and to apparatus for assisting in obtaining acquisition by enabling the loop to latch on more rapidly and over a wider frequency range.

BACKGROUND OF THE INVENTION

When transmitting digital data at a very high bit rate, the signal needs to be regenerated periodically, both in amplitude and in phase. To do this, it is necessary to have a clock which has been extracted from the transmitted data, and this gives rise to a difficult filtering problem when the codes used are of the NRZ or of the RZ type since there are few transitions. Apart from passive filter devices such as surface wave filters, for example, phase lock loops are used. In this application which consists in isolating a particular frequency component from a spectrum, the loops are known as "narrow" loops (having a natural angular frequency which is small compared with the central angular frequency), thereby giving rise to a narrow acquisition band and to long acquisition time.

Several circuits are known for mitigating these drawbacks:

A voltage controlled crystal oscillator may be used which makes it possible to have a central frequency of sufficiently high accuracy to be within the acquisition band under all circumstances. Acquisition time is then short since the initial frequency difference is small. However, using a crystal at high bit rates (greater than 34 Mbit/s) gives rise to high costs and in addition does not avoid the need for any adjustment.

A frequency lock loop may be added to the initial phase lock loop. One such system is described in U.S. Pat. No. 4,015,083 relating to a circuit for correcting synchronization errors. This circuit generates an error voltage proportional to the frequency difference between its input and its output, and the error voltage is used to provide frequency locking. This apparatus gives rise to a complex circuit requiring difficult phase adjustments.

Another method consists in using an external sawtooth generator whose output is added to the control voltage of the voltage controlled oscillator. This causes the oscillator to sweep through frequencies. Its passage through the locked condition is detected by using a second phase comparator operating in quadrature with the first, together with a lowpass filter and a level comparator. Locking causes a DC component to appear at the output from the second phase comparator and this is detected by the lowpass filter and the level comparator, at which point the sawtooth sweeping signal is switched off. This apparatus requires a large number of external components and, in addition, suffers from low immunity to jitter in the input signal.

The aim of the invention is to mitigate the drawbacks of known solutions, and to obtain apparatus which is simple to make and easy to implement.

SUMMARY OF THE INVENTION

The present invention provides a method of assisting a phase lock loop in obtaining acquisition, the phase lock loop receiving an input signal of frequency $f1$ and including: a phase comparator; a lowpass filter; a loop filter; and a voltage-controlled oscillator delivering a signal at frequency $f2$ prior to locking; said lowpass filter delivering a sawtooth signal at frequency $f1-f2$ to the loop filter; the method being characterized by the fact that, outside the phase lock loop, said sawtooth signal is shaped by a hysteresis comparator, that the shaped signal is filtered to remove frequencies below a capture frequency of the phase lock loop, that the filtered signal is multiplied by a low frequency squarewave signal in order to obtain a multiplied signal, that said multiplied signal is integrated in order to obtain a sweep signal so long as acquisition has not been obtained, and that said oscillator is controlled by said sweep signal in order to vary its frequency, said sweep signal having a frequency equal to the frequency of said low frequency signal and passing linearly from a positive peak value to a negative peak value, and vice versa.

The invention also provides apparatus for implementing the method of the invention, and comprising: a hysteresis comparator; a highpass filter; a multiplier; and a low frequency squarewave generator; the hysteresis comparator being connected to the output of the lowpass filter of the phase lock loop, the highpass filter being connected to the output from the hysteresis comparator, the multiplier having one input connected to the output from the highpass filter, one input connected to the output from the generator, and an output connected to the loop filter of said phase lock loop.

Conventionally, a phase lock loop receiving an input signal is constituted by a phase comparator, a lowpass filter, a loop filter, and a voltage controlled oscillator, with the lowpass filter delivering a sawtooth signal to the loop filter. In accordance with the invention, said sawtooth signal is multiplied outside the phase lock loop, by a low frequency squarewave signal, and the signal obtained by the multiplication is integrated in order to obtain a sweep signal which is applied to the oscillator in order to vary its frequency between two extreme values.

Once phase lock loop locking has been acquired, the sweep signal disappears. However, in order to prevent a sweep signal from appearing after locking in the presence of jitter in the input signal or even when the input signal comprises a long sequence of "0" or "1", the sawtooth signal is shaped by a hysteresis comparator prior to multiplication. Finally, and still in accordance with the invention, the signal resulting from the comparison is filtered in order to remove frequencies below the capture frequency of the phase lock loop.

The method of the invention is implemented in apparatus for assisting a phase lock loop in obtaining acquisition. This apparatus has the followiong advantages:

once acquisition has been obtained, the apparatus for assisting in obtaining acquisition is totally inhibited and therefore does not disturb the operation of the phase lock loop on its own;

the apparatus is capable of being totally integrated and only requires a small number of extra components to be added to the initial phase lock loop, which minimizes additional power consumption;

the external components are conventional and therefore cheap (no crystals or surface wave filters);

there is no need to perform adjustments when the apparatus is put into operation; and it is capable of extracting the clock signal from a binary signal including long sequences of "0" or "1", and even when disturbed by a large amount of jitter.

BRIEF DESCRIPTION OF THE DRAWINGS

An embodiment of the invention is described by way of example with reference to the accompanying drawings, in which:

FIG. 2 shows the appearance of different signals at various points of the FIG. 1 apparatus.

MORE DETAILED DESCRIPTION

Figure 1:
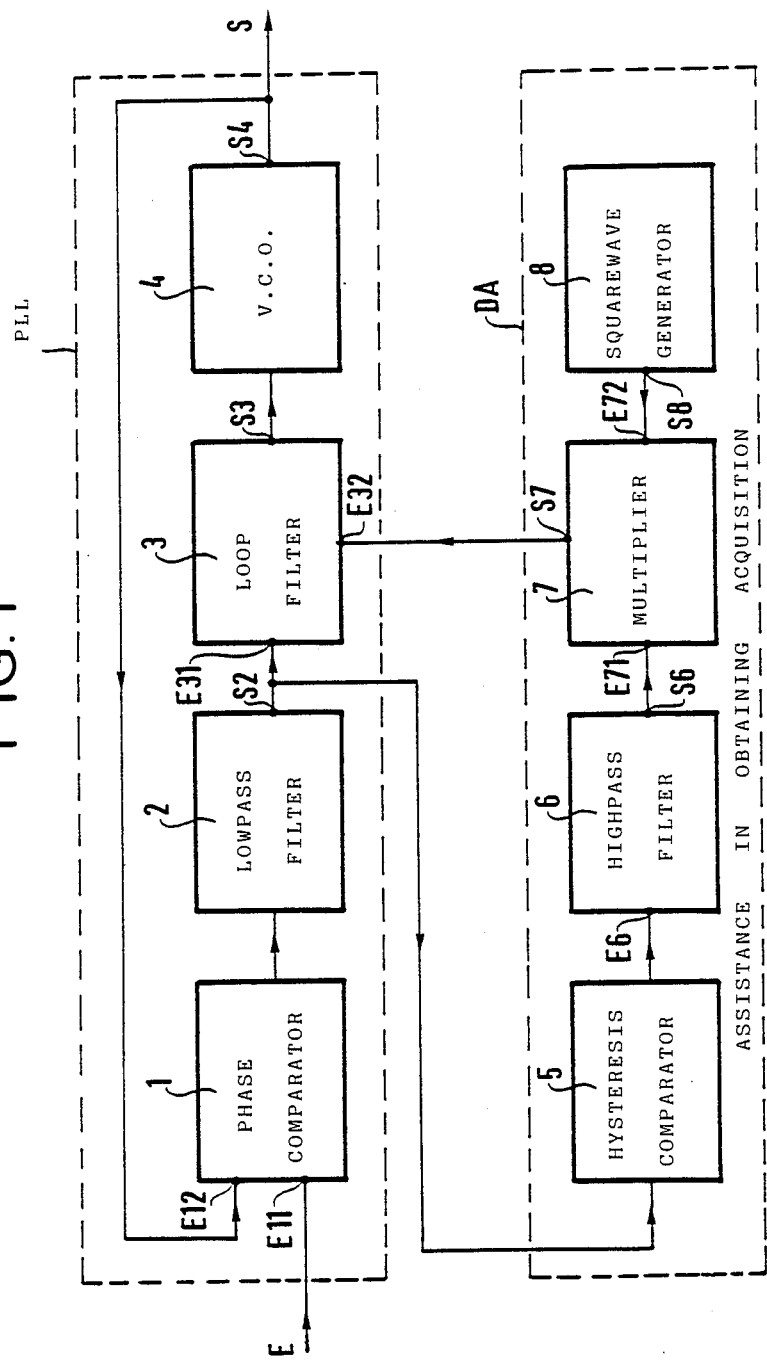
FIG. 1 is a block diagram of apparatus in accordance with the invention.

FIG. 1 shows a conventional phase lock loop PLL together with apparatus for assisting in obtaining acquisition DA in accordance with the invention.

The phase lock loop PLL comprises: a phase comparator 1 (of the exclusive OR type) having a triangular, sawtooth characteristic and having a first input E11 which receives an input signal E; a lowpass filter 2 having an input connected to the output from the phase comparator; a loop filter 3 having a first input E31 connected to the output S2 from the lowpass filter 2; and a voltage controlled oscillator 4 having an input connected to the output S3 of the loop filter 3, and having an output S4 connected to a second input E12 of the phase comparator 1. The output S4 also delivers an output signal S.

The apparatus DA for assisting in obtaining acquisition comprises: a hysteresis comparator 5 having its output connected to the output S2 from the lowpass filter 2; a highpass filter 6 having an input E6 connected to the output from the hysteresis comparator 5; a two-quadrant multiplier 7; and a low frequency squarewave signal generator 8 of period P; with the multiplier 7 having a first input E71 connected to the output S6 of the highpass filter, a second input E72 connected to the output S8 from the generator 8, and an output S7 connected to a second input E32 to the loop filter 3.

The operation of the assembly comprising the phase lock loop PLL and the apparatus DA for providing assistance in obtaining acquisition is described by initially supposing that the phase lock loop is open between the loop filter 3 and the oscillator 4. The input signal E has a frequency f1 and the output signal S has a frequency f2, which is different from f1.

The phase comparator 1 delivers a signal including the frequency sum component $f1+f2$ and the frequency difference components $f1-f2$. For example if the frequency f1 is greater than the frequency f2, the sum $f1+f2$ is eliminated by the lowpass filter 2. Consequently, the signal at the output S2 from the lowpass filter is the image of the characteristic of the sawtooth signal delivered by the phase comparator 1, i.e. a triangle of frequency $f1-f2$ and amplitude A. The hysteresis of the hysteresis comparator 5 is adjusted to a value $A-e$ which is slightly less than A so as to trigger on the signal delivered by the lowpass filter. At the output from the hysteresis comparator, and thus at the input E6 to the highpass filter, there appears a squarewave signal having a low level 0 and a high level A, still at the frequency $f1-f2$ (as shown in FIG. 2) which signal is transmitted from the output S6 of the highpass filter 6 which is assumed to be transparent at the frequency $f1-f2$. The signal delivered by the highpass filter 6 via output S6 (FIG. 2) is received by the multiplier 7 on its single-pole, first input E71; while on its two-pole, second input E72 the multiplier receives a squarewave signal delivered by the generator 8 via output S8 (FIG. 2) which squarewave signal has a frequency 1/T chosen to be small compared with the capture frequency of the phase lock loop. The capture frequency is the maximum frequency difference from which locking can be obtained without a phase jump, and thus without triggering the hysteresis comparator 5. Further, the squarewave signal delivered by the generator 8 comprises positive and negative half-cycles, with the sign of the voltage of this signal changing each time the squarewave signal switches over. Consequently, the signal delivered by the output S7 of the multiplier and as shown in FIG. 2 comprises: a squarewave signal between a low level 0 and a high level I at a frequency $f1-f2$ for positive half-cycles of the signal delivered by the generator 8; and a squarewave signal having a low level $-I$ and a high level 0 again at a frequency $f1-f2$ during negative half-cycles of the signal delivered by the generator 8. The signal delivered by the multiplier 7 is then integrated by the loop filter 3 as explained below. As shown in FIG. 2, the sweep signal delivered at the output S3 of the loop signal comprises a positive slope of amplitude $+U$ corresponding to integration of the positive portion of the signal at the output S7 of the multiplier, followed by a negative slope of amplitude $-U$ corresponding to integration of the negative portion of the signal at the output S7. The signal delivered by the loop filter 3 is thus a triangular voltage of period P passing through the value 0 in the middle of each of its positive and negative slopes.

The oscillator 4 is voltage controlled by the sweep signal delivered by the loop filter, and therefore sweeps linearly in frequency while the loop is closed.

The frequency difference between the signals delivered by the outputs S6 and S8 (FIG. 2) is, in fact, much greater than that shown in the figure, but naturally operation remains the same. Similarly the sweep signal delivered at the output S3 (FIG. 2) ought to be shown as a staircase type signal, with each "riser" corresponding to integration of a single pulse in the signal at output S7, but the greater the frequency difference, the narrower the steps. The sweep signal can thus be assumed to vary linearly between $+U$ and $-U$. It may be observed that the loop filter 3 also receives the sawtooth signal delivered by the lowpass filter 2, and that this signal is superposed at the output S3 of the loop filter on the sweep signal. The level of this sawtooth signal at frequency $f1-f2$ is much less than the level of the sweep signal, and it has therefore not been shown in FIG. 2. However, it should be observed that after locking has been obtained, the sweep signal is switched off as explained below and only the sawtooth signal remains, with this signal being the signal from the phase lock loop in normal operation.

Closed loop operation is now described. When the loop is initially closed, it is not locked, and consequently the frequencies of the inlet signal E and the outlet signal S are different, which corresponds to the above-described case. The phase comparator 1 delivers a sawtooth signal at the beat frequency $f1-f2$ between the frequency f1 of the input signal and the frequency f2 of the output signal. As mentioned above, the apparatus DA for assisting in obtaining acquisition uses the sawtooth signal as delivered by the lowpass filter 2 (and which is the image of the sawtooth signal delivered by the phase comparator 1) to generate a signal which is applied to the loop filter 3, which in turn delivers the sweep control signal to the oscillator 4. At the output S3 from the loop filter, the signal delivered by the lowpass filter 2 at each output S2 is superposed on the sweep signal, with the signal at S2 being the natural acquisition signal of the phase lock loop PLL. However, so long as the frequency difference f1−f2 is greater than the capture band, the sweep signal is preponderant and acts effectively alone. Conversely, once the capture band has been entered, the phase jumps disappear and as a result the sweep signal also disappears.

Thus, all that remains at the output S3 of the loop filter is the natural locking signal which leads very rapidly to synchronization since operation is taking place in the capture band. Regardless of the initial frequency difference, the time to acquisition is thus less than 3T/2, where T is the period of the low frequency squarewave signal generator 8. This maximum time corresponds to a single jump between the two extreme operating frequencies taking place immediately after the generator 8 has switched over.

Next time it switches over, when the squarewave signal changes sign, the sweep signal will not be at the extreme frequency since sweeping takes place at constant slope and will have been running for less than T/2. It is then necessary to wait for one new period of the sweep signal in order to obtain locking.

Figure 3:
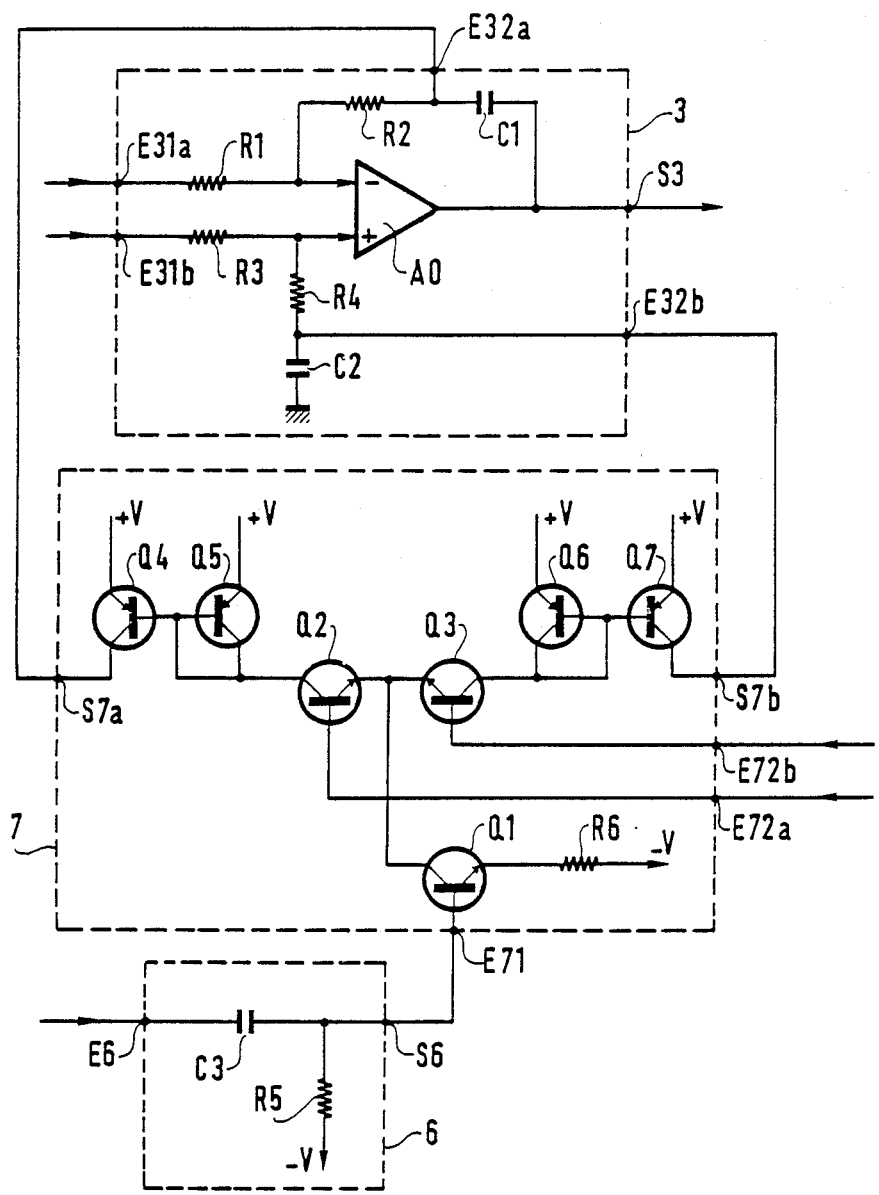
FIG. 3 is a circuit diagram of some of the members of FIG. 1.

FIG. 3 shows the loop filter 3, the highpass filter 6, and the two-quadrant multiplier 7.

The highpass filter comprises a capacitor C3 between the input E6 and the output S6 together with a resistor R5 between the output S6 and a negative voltage −V.

The multiplier 7 comprises seven transistors Q1 to Q7 and a resistor R6. Transistors Q1, Q2, and Q3 are NPN type transistors and transistors Q4 to Q7 are PNP type transistors. Transistors Q2 and Q3 have their emitters connected to a common point which is connected to the collector of transistor Q1 whose own emitter is connected via the resistor R6 to the negative voltage −V. The base of transistor Q1 is connected to the input E71 of the multiplier.

The base of transistor Q2 is connected to an input E72a of the multiplier while the base of transistor Q3 is connected to an input E72b. Together the inputs E72a and E72b constitute the input E72 of FIG. 1, thus constituting a two-wire input. The collector of transistor Q2 is connected to the collector of transistor Q5 and the connector of transistor Q3 is connected to the collector of transistor Q6. Transistors Q4 and Q5 have their bases connected to a common point which is connected to the collector of transistor Q5. The emitters of transistors Q4 and Q5 are connected to a positive voltage +V. Transistors Q6 and Q7 have their bases connected to a common point which is connected to the collector of transistor Q6. The emitters of transistors Q6 and Q7 are connected to a positive voltage +V. The collector of transistor Q4 is connected to an output S7a of the multiplier, and the collector of transistor Q7 is connected to an output S7b of the multiplier. These two outputs S7a and S7b constitute the output S7 shown in FIG. 1, which is a two-wire output. The positive and negative voltages +V and −V are voltages provided by a DC power supply.

The loop filter 3 is of conventional type and comprises an operational amplifier A0, four resistors R1 to R4 and two capacitors C1 to C2. The operational amplifier has an output connected to the output S3 of the loop filter, a negative input connected firstly to the output via a series circuit constituted by the resistor R2 and the capacitor C1, and secondly to an input terminal E31a via resistor R1, and a positive input connected firstly to another input terminal E31b via resistor R3 and secondly to ground via a series circuit constituted by resistor R4 and capacitor C2. The inputs E31a and E31b constitute the input E31 shown in FIG. 1 which is a two-wire input.

A point common to the resistor R2 and the capacitor C1 is connected to an input E32a which is in turn connected to the output S7a of the multiplier. A common point between the resistor R4 and the capacitor C2 is connected to another input E32b which is in turn connected to the output S7b of the multiplier. The inputs E32a and E32b of the loop filter 3 constitute the input E32 of FIG. 1, which is a two-wire input. Resistors R1 and R3 have the same value and so do resistors R2 and R4, and capacitors C1 and C2 have the same value: C1=C2=C.

During the locking stage, the voltge at input E6 of the highpass filter 6 is a squarewave of amplitude A. After passing through the highpass filter constituted by the capacitor C3 and the resistor R5, the output S6 of the highpass filter provides the same signal but centered on the negative voltage −V of the power supply. This signal is applied to transistor Q1 which together with resistor R6 constitutes a controlled current source. When the signal at the output S6 is at the high level, the collector current through the transistor Q1 has a value I which is a function of the resistor R6, whereas when the signal of the output S6 is at the low level, transistor Q1 is switched off and the current is zero. Transistors Q2 and Q3 constitute a differential pair controlled by the voltage from the low frequency squarewave generator 8. Since this voltage alternates between being positive and negative at S8, as shown in FIG. 2, the current from transistor Q1 is switched alternately to the collector of transistor Q2 and to the collector of transistor Q3. Thus, as a differential, the output S7 of the multiplier 7 provides the signal shown in FIG. 2 with amplitudes I and −I. Pairs of transistors Q4 & Q5 and Q6 & Q7 constitute two current mirrors for feeding the loop filter 3 without saturating transistors Q2 and Q3.

The loop filter 3 is of the integral type and behaves as an integrator with respect to current. The voltage V(S3) at the output from the loop filter is:

$$V(S3)=(1/C)\int i(t)\cdot dt$$

Where:
i(t) is the differential current, and C=C1=C2.

The function of the highpass filter 6 is given below.

When latching is achieved, the output from the hysteresis comparator may be in the high state (depending on the initial sign of the frequency difference f1−f2). In this case, transistor Q1 remains conductive and continues to feed the loop filter, thereby disturbing operation. The presence of the highpass filter 6 brings the base of transistor Q1 to negative potential −V after a certain time lapse, thereby switching off transistor Q1. The time constant should be selected in such a manner as to pass the loop capture frequency, which capture frequency is the minimum frequency appearing at the output from hysteresis comparator 5, and also in such a manner as to switch off transistor Q1 and thus switch off the sawtooth of the sweep signal before it moves out from the capture range.

The advantage of the hysteresis comparator is as follows. In normal operation, the signal E at the input to the phase lock loop receives a random digital signal together with a degree of jitter. The high frequency portion of the jitter is demodulated by the loop and appears in the error signal which is the signal at output S2 of the lowpass filter 2. If the comparator 5 were a simple comparator, it would trigger and lose locking, however since it is a hysteresis comparator, it only triggers if the amplitude of the jitter exceeds $A-e$ which is the predetermined value of the hysteresis. The maximum jitter G max that can be tolerated at high frequencies is:

$$G\max = (A-e)/g1 = 0.5\ T1 = \pi$$

Where g1 is the gain of the phase comparator and is equal to $A/\pi$ for an exclusive OR, and T1 is the period of the input signal of frequency f1.

Similarly, the random nature of the input signal E, and more particularly a long sequence of "0" or "1", gives rise to unlocking at the output from the phase comparator 1. Here again, hysteresis serves to solve the problem and avoid unlocking.

With an input signal E at 100 MHz and a phase lock loop constituted by: an exclusive OR phase comparator of the F 100 107 type with gain g1=0.5 V/radian; an RC type lowpass filter having a cutoff frequency of 30 MHz; a loop filter with time constants R1.C=4.5 ms and R2.C=0.224 ms; and a voltage controlled oscillator of gain g3=7 MHz/V, the following results are obtained:

on its own the loop has a noise band of 100 KHz and a maximum jitter amplitude G max=1.01, it is thus suitable for clock recovery; and the capture band is 280 KHz, and the maximum acquisition time corresponding to a frequency jump of 6 MHz is 300 ms; with larger frequency jumps causing locking to be lost.

To the above-described phase lock loop, there is added apparatus in accordance with the invention constituted by: a hysteresis comparator constituted by a looped high-speed comparator with the value of the hysteresis being fixed at 700 mV; a highpass filter having a cutoff frequency of 36 MHz, a two-quadrant multiplier having gain equal to 2.7 mA/$V^2$; and a low frequency generator of period T=15 ms.

The loop filter capacitors C1 and C2 have a value of 1 microfarad. Consequently, the peak-to-peak amplitude of the sweep signal is 4 volts at a period of 15 ms. The range of frequencies by the oscillator is thus 4g3=28 MHz.

This apparatus thus provides the following results:

the loop latches onto frequency jumps of 20 MHz in less than 23 ms;

the maximum jitter G max that can be tolerated is 0.35 T1 (where T1 is the period of the input signal), which figure is comparable to the figure obtained with other systems; and the maximum number of consecutive "0s" that can be tolerated in the input signal is 450 on a pseudo-random sequence of length $2^{15}-1$, which is excellent.

These results show that the apparatus for providing assistance in obtaining acquisition in accordance with the invention when used in association with a phase lock loop provides much better clock recovery than can be obtained by the phase lock loop on its own. A gain of at least twenty is obtainable on the acquisition time in comparison with a loop on its own.

I claim:

1. A method of assisting a phase lock loop in obtaining acquisition, the phase lock loop receiving an input signal of frequency f1 and including: a phase comparator; a lowpass filter; a loop filter; and a voltage-controlled oscillator delivering a signal at frequency f2 prior to locking, and said lowpass filter delivering a sawtooth signal at frequency f1−f2 to the loop filter; the method comprising the following steps taking place outside the phase lock loop:

said sawtooth signal is shaped by a hysteresis comparator;

the shaped signal is filtered to remove frequencies below a capture frequency of the phase lock loop;

the filtered signal is multiplied by a low frequency squarewave signal in order to obtain a multiplied signal;

so long as acquisition has not been obtained, said multiplied signal is integrated in order to obtain a sweep signal; and said oscillator is controlled by said sweep signal in order to vary its frequency, said sweep signal having a frequency equal to the frequency of said low frequency signal and passing linearly from a positive peak value to a negative peak value, and vice versa.

2. A method according to claim 1, wherein the multiplied signal is integrated inside the loop by the loop filter.

3. Apparatus for assisting a phase lock loop in obtaining acquisition, the apparatus implementing the method according to claim 2 and comprising: a hysteresis comparator; a highpass filter; a multiplier; and a low frequency squarewave generator; the hysteresis comparator being connected to the output of the lowpass filter of the phase lock loop, the highpass filter being connected to the output from the hysteresis comparator, the multiplier having one input connected to the output from the highpass filter, one input connected to the output from the generator, and an output connected to the loop filter of said phase lock loop.

4. Apparatus for providing assistance in obtaining acquisition according to claim 3, wherein the highpass filter is constituted by a capacitor connected between an input and an output of said highpass filter together with a resistor connected between said output and a negative voltage, and that the multiplier comprises a first current mirror, and a second current mirror each connected to a positive voltage, a differential circuit constituted by two transistors each having a base connected to the output of the generator and each connected to one of the current mirrors, said differential circuit being also connected via a third transistor and a resistor in series to said negative voltage, said third transistor having a base connected to said output from the highpass filter, and each current mirror being connected to the loop filter of the phase lock loop.

* * * * *